US012224337B2

(12) United States Patent
Beumer et al.

(10) Patent No.: US 12,224,337 B2
(45) Date of Patent: Feb. 11, 2025

(54) PGAN ENHANCEMENT MODE HEMTs WITH DOPANT DIFFUSION SPACER

(71) Applicant: Intel Corporation, Santa Clara, CA (US)

(72) Inventors: Michael Beumer, Portland, OR (US); Robert Ehlert, Portland, OR (US); Nicholas Minutillo, Beaverton, OR (US); Michael Robinson, Beaverton, OR (US); Patrick Wallace, Portland, OR (US); Peter Wells, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 901 days.

(21) Appl. No.: 17/132,951

(22) Filed: Dec. 23, 2020

(65) Prior Publication Data

US 2022/0199816 A1 Jun. 23, 2022

(51) Int. Cl.
*H01L 29/778* (2006.01)
*H01L 29/20* (2006.01)
*H01L 29/205* (2006.01)
*H01L 29/66* (2006.01)

(52) U.S. Cl.
CPC ...... *H01L 29/7786* (2013.01); *H01L 29/2003* (2013.01); *H01L 29/205* (2013.01); *H01L 29/66462* (2013.01)

(58) Field of Classification Search
CPC ..... H01L 2924/13064; H01L 29/66431; H01L 29/66462; H01L 29/66469; H01L 29/778; H01L 29/7781; H01L 29/7782; H01L 29/7783; H01L 29/7784; H01L 29/7786;
(Continued)

(56) References Cited

U.S. PATENT DOCUMENTS 7,612,390 B2 * 11/2009 Saxler ................. H01L 29/7783
257/E29.246
8,698,547 B2 * 4/2014 Nakao .................... H03K 17/06
327/434
(Continued)

FOREIGN PATENT DOCUMENTS

CN 109244130 1/2019

OTHER PUBLICATIONS

Extended European Search Report from European Application No. 21997399.5 notified Mar. 15, 2022, 10 pgs.
(Continued)

*Primary Examiner* — Eduardo A Rodela
(74) *Attorney, Agent, or Firm* — Essential Patents Group, LLP

(57) ABSTRACT

III-N e-mode high electron mobility transistors (HEMTs) including a dopant diffusion spacer between an impurity-doped III-N material layer and a III-N polarization layer of the HEMT material stack. The spacer may be a substantially undoped III-N material, such as GaN. With the diffusion spacer, P-type impurities within the pGaN are setback from the polarization layer sufficiently to avoid significant levels of P-type impurities from entering the III-N material interface where the 2DEG resides. With the diffusion spacer, clustering of impurities near the 2DEG may be avoided and a III-N e-mode HEMT may achieve higher drive currents.

20 Claims, 7 Drawing Sheets

(58) Field of Classification Search
CPC ............ H01L 29/7787; H01L 29/2003; H01L 29/205
See application file for complete search history.

(56) References Cited

U.S. PATENT DOCUMENTS

| | | | |
|---|---|---|---|
| 8,946,894 B2* | 2/2015 | Railkar | H01L 23/34 |
| | | | 257/E21.267 |
| 9,773,900 B2* | 9/2017 | Tomita | H01L 29/1066 |
| 10,224,401 B2* | 3/2019 | Mishra | H01L 29/4236 |
| 10,797,168 B1* | 10/2020 | Moens | H01L 29/66462 |
| 2017/0104573 A1* | 4/2017 | Ryan | H04B 1/525 |
| 2017/0263710 A1* | 9/2017 | Matsumoto | H01L 29/7787 |
| 2017/0293017 A1* | 10/2017 | Evangelista | G01S 7/034 |

OTHER PUBLICATIONS

Abdulsalam, Azwar, et al., "On the threshold voltage of normally-OFF AiGaN/GaN heterostructure field effect transistors (HFETs) with p-(Al)GaN gate", Semiconductor Science and Technology 35, 2020, 9 pgs.

* cited by examiner

PGAN ENHANCEMENT MODE HEMTs WITH DOPANT DIFFUSION SPACER

BACKGROUND

High electron mobility transistors (HEMT), such as III-N heterostructure field effect transistors (HFET), employ a semiconductor heterostructure with one or more heterojunction, for example at an interface of a first III-N semiconductor alloy, such as GaN, and another III-N semiconductor alloy, such as AlGaN or AlInN GaN-based HEMT devices benefit from the relatively wide bandgap (~3.4 eV), enabling higher breakdown voltages than Si-based MOSFETs.

Many HEMT architectures are operative only in depletion mode (d-mode), where a gate voltage of non-zero magnitude is required to shut off the device. While d-mode devices are useful, it is often advantageous for a device to be operable in enhancement mode (e-mode), which are in an "off" state when there is no applied gate bias. E-mode devices can, for example, reduce IC power consumption. In GaN HEMT technology, one way of achieving e-mode operation is with a recessed gate architecture. However, recessing the gate electrode sufficiently without sacrificing "on" state performance is challenging. In some alternative e-mode HEMT architectures, electrically active dopants are introduced into a III-N semiconductor material stack. However, drive currents of such doped e-mode HEMT architectures has suffered.

III-N HEMT e-mode architectures that offer superior performance would therefore be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
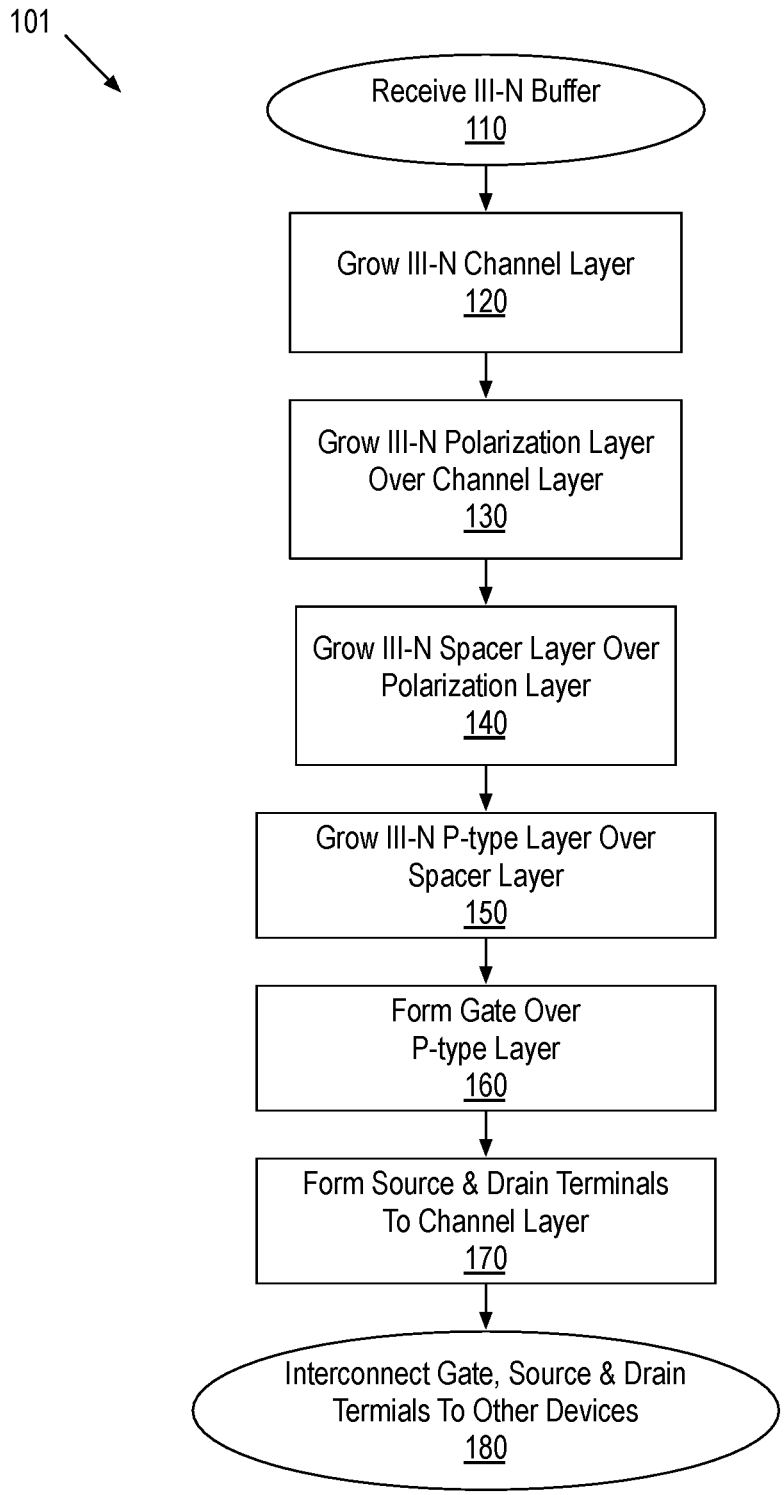
FIG. 1 is a flow diagram of methods 1 for fabricating an e-mode III-N HEMT, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described below are III-N e-mode HEMTs including a dopant diffusion spacer between an impurity doped p-type III-N material layer and a III-N polarization layer of the HEMT material stack. As described further below, the III-N spacer material may be an alloy of nitrogen and at least one Group III constituent, such as Ga. In some embodiments, the spacer material layer is a binary alloy of Ga and N. The spacer material layer is advantageously grown with no intentional doping. The diffusion spacer physically separates impurities in the p-type layer from the polarization layer to avoid significant levels of P-type impurities from entering the III-N material interface where the 2DEG resides. With the diffusion spacer, P-type impurities within the p-type III-N layer can still deplete the two-dimensional electron gas (2DEG) within the HEMT channel.

The inventors have found that p-type impurities, such as Mg, diffuse readily through III-N material, and so the presence of a p-type III-N layer in close proximity with adjacent layers can be detrimental, particularly if the impurities enter the region of a III-N material stack where a 2DEG is to reside. Upon identifying this issue, rather than reduce the impurity dopant concentrations within the p-type material or reduce the temperature of the p-type III-N layer in an effort to curtail impurity diffusion within a HEMT heterostructure, the inventors have sought to maximize doping within the p-type material, but space that p-type material a greater distance apart from the 2DEG. With a high temperature p-type material growth, the p-type material can have high impurity doping and low crystal defect density. The heavily doped p-type material can deplete the 2DEG sufficiently for e-mode operation even when spaced a greater distance apart from the 2DEG by the intervening spacer material. Because of the greater distance, few impurities are able to reach the region of the material stack where the 2DEG resides even during high temperature epitaxy of the p-type III-N layer. Hence, the III-N spacer material layer is referred to herein as a dopant diffusion spacer.

FIG. 1 is a flow diagram of methods 101 for fabricating an e-mode III-N HEMT, in accordance with some embodiments. FIGS. 2, 3, 4, 5, and 6 are cross-sectional views of an III-N e-mode HEMT 200 evolving as the methods 101 are practiced, in accordance with some embodiments.

In FIG. 1, methods 101 begin with receiving a substrate with a III-N buffer at input 110. Various epitaxial growth processes and/or patterning processes may be employed upstream of methods 101 to prepare the substrate for the fabrication of a III-N transistor. Any buffer structure known to be suitable for a III-N device may be prepared and received at input 110. At block 120, a III-N channel layer is epitaxially grown on a surface the buffer. Epitaxial growth of the crystalline III-N channel material at block 120 may utilize any known III-N epitaxy/deposition techniques, such as, but not limited to, metal-organic chemical vapor deposition (MOCVD), molecular beam epitaxy (MBE), or hydride vapor phase epitaxy (HVPE). In some embodiments, elevated temperatures of 900° C., or more, are employed to grow a channel material of high crystal quality. At these temperatures, a III-N crystal can be grown at a rate of a few μm/hour, for example.

At block 130, a III-N polarization material is epitaxially grown over the channel layer, for example at elevated temperatures of at least 900° C. The polarization layer is a III-N alloy that includes more Al than the channel layer. In some exemplary embodiments the III-N polarization material is grown directly upon the channel layer. However, in other embodiments one or more material layers may be grown upon the channel layer before the polarization layer is grown. Methods 101 continue at block 140 where a III-N spacer layer is grown over the polarization layer. Epitaxial growth of the spacer material may again utilize any known techniques, such as, but not limited to MOCVD, MBE, HYPE. In advantageous embodiments, the spacer layer growth is a recipe step in a multi-step epitaxial growth recipe that follows a prior recipe step employed to grow the polarization material. Growth of the spacer material may therefore also be at a temperature of at least 900° C. In exemplary embodiments, the growth process at block 140 comprises no in-situ doping of the spacer material so that intrinsic III-N material is grown upon the polarization material.

Figure 2:
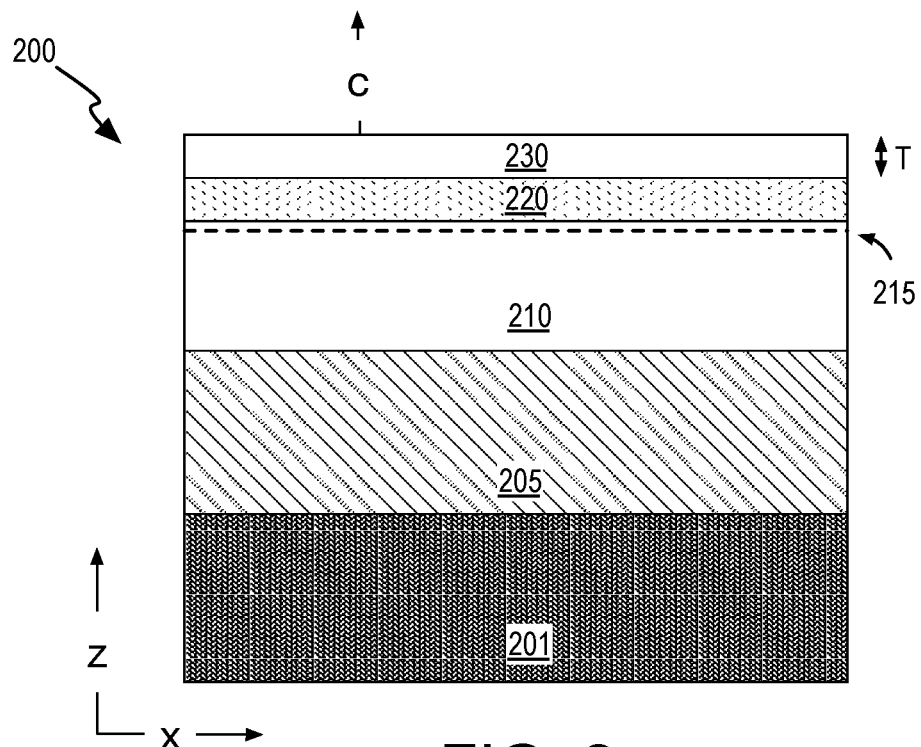
FIGS. 2, 3, 4, and 5 are cross-sectional views of an III-N e-mode HEMT evolving as the methods illustrated in FIG. 1 are practiced, in accordance with some embodiments.

In the example further illustrated in FIG. 2, transistor structure 200 comprises a substrate 201, a buffer structure 205, a channel material 210, a polarization material 220, and a spacer material 230. In some embodiments, substrate 201 is silicon carbide (SiC), GaN, or sapphire. For other embodiments, substrate 201 comprises only cubic, group-IV materials (e.g., Si, Ge, SiGe). In some examples, the substrate is a substantially monocrystalline (111) silicon substrate. Lattice mismatch between silicon and III-N crystals is most easily accommodated for the (111) plane. Nevertheless, other crystallographic orientations having greater lattice mismatch are also possible, such as, but not limited to, the (100), or (110) plane. Substrate 201 may be bulk semiconductor or may be semiconductor on insulator (SOI).

Buffer structure 205 may have a wide variety of compositions and structures designed to confine lattice defects. While buffer structure 205 may vary, examples include an MN and/or AlGaN nucleation layer directly on a seeding surface of substrate 201, with one or more AlGaN and/or GaN layers over the nucleation layer. Buffer structure 205 may be microns thick, for example.

The III-N channel material 210 is monocrystalline with hexagonal crystallinity and the c-axis oriented substantially orthogonal (e.g., <10° off) from the seeding surface of the buffer. Crystal quality of channel material 210 is generally better than that of buffer structure 205. In some embodiments, threading dislocation density within channel material 210 is at least two orders of magnitude lower than within buffer structure 205, and therefore of sufficient quality for developing a two-dimensional electron gas (2DEG) 215. In advantageous embodiments, threading dislocation density with channel material 210 is less than $1 \times 10^{11}$ cm$^{-2}$.

In some exemplary embodiments, channel material 210 a binary alloy of Ga and nitrogen (i.e., GaN). In some advantageous embodiments, the GaN is intrinsic, having no intentional donor or acceptor impurity doping. For example, the concentration of all impurities (e.g., oxygen, Si, Mg, etc.) is advantageously less than 1e17 atoms/cm$^3$ (e.g., 1e14-1e16 atoms/cm$^3$). Although intrinsic GaN channel material of highest purity offers the advantage of highest carrier mobility, it is nevertheless possible to grow channel materials with alternative alloy compositions. Hence, channel material 210 may instead be another binary alloy (e.g., InN), a ternary alloy (e.g., $Al_xIn_{1-x}N$, $In_xGa_{1-x}N$, or $Al_xGa_{1-x}N$), or a quaternary alloy (e.g., $In_xGa_yAl_{1-x-y}N$). Thickness of channel material layer 210 may vary, but in some embodiments is at least 50 nm, and may be 75-100 nm, or even more.

Polarization material 220 may similarly include any binary, ternary, or quaternary III-N alloy that has a spontaneous polarization and/or piezoelectric polarization suitable for inducing a charge carrier sheet (e.g., 2-D electron gas 215) within the underlying III-N channel material 210. As shown in FIG. 2, in the presence of polarization material 220, 2DEG 215 forms within III-N channel material 210, in a region proximal to the material interface with polarization material 220. The 2DEG 215 may be located within a few nanometers of the heterojunction with polarization material 220, for example.

In an embodiment, polarization material 220 includes a material comprising more Al than is present in channel material 210. Hence, the polarization material may, for example, comprise predominantly Ga, Al, and N. In some examples where channel material 210 is binary GaN, polarization material 220 is $Al_zGa_{1-z}N$ (e.g., where Z ranges from 0.2-0.5). In other embodiments, polarization material 220 is $Al_wIn_{1-w}N$ (e.g., where W ranges from 0.7-0.85), or AlN. Impurity concentrations within polarization material 220 are below 1e19 atoms/cm$^3$, advantageously below 1e18 atoms/cm$^3$, and more advantageously below 5e17 atoms/cm$^3$.

The layer thickness of the polarization material 220 may vary with material composition. A layer of $Al_zGa_{1-z}N$ can have a thickness between 5 nm and 15 nm, for example. In an exemplary embodiment where polarization material 220 is $Al_zGa_{1-z}N$ with Z being 20-30 atomic percent, the layer thickness (z-dimension) is approximately 6-8 nm. In another example where polarization material 220 is $Al_wIn_{1-w}N$, the layer thickness is between 5 nm and 20 nm, depending on the Al concentration. For example, for W between 60 and 80 atomic percent, the $Al_wIn_{1-w}N$ layer thickness may vary between 20 nm and 5 nm, respectively.

In some further embodiments, there may be an intermediate layer (not depicted) between polarization material 220 and channel material 210. Such an intermediate layer may help to seed polarization material 220, for example. Such a seed layer may have a thickness of 1 nm, or less, for example. The seed layer may be a binary alloy, such binary AlN, which may be in direct contact with channel material 210. Polarization material 220 (e.g., $Al_zGa_{1-z}N$) is then in contact with the binary AlN layer.

FIG. 2 further illustrates III-N spacer material 230, which is in direct contact with polarization material 220. In exemplary embodiments, spacer material 230 is a binary alloy of Ga and nitrogen (i.e., GaN). Spacer material 230 may have other III-N alloy compositions that have a sufficient lattice match with polarization material 220 to retain good crystal quality. For example, spacer material 230 may be a ternary alloy (e.g., $Al_xIn_{1-x}N$, $In_xGa_{1-x}N$, or $Al_xGa_{1-x}N$), or a quaternary alloy (e.g., $In_xGa_yAl_{1-x-y}N$). Spacer material 230 may have a thickness T of at least 2 nm, and advantageously 5-10 nm. In some advantageous embodiments, spacer material 230 has no intentional donor or acceptor impurity doping. For example, the concentration of all impurities, but for diffusion from external sources, would be less than 1e17 atoms/cm$^3$. However, as described further below, dopants (e.g., Mg) may diffuse into spacer material 230 reaching a concentration of 1-5e18 atoms/cm$^3$ in some portion of spacer material 230, for example.

Returning to FIG. 1, methods 101 continue at block 150 where a monocrystalline layer of p-type III-N material is epitaxially grown upon the spacer material. P-type material growth at block 150 may also comprise an epitaxy process performed at elevated temperature (e.g., of at least 900° C.), ensuring good crystal quality. In exemplary embodiments, the p-type material growth is a recipe step in a multi-step epitaxial growth recipe that follows a prior recipe step employed to grow the spacer material. Growth of the p-type material may therefore comprise the same Group III (e.g., tri-methyl-gallium, TMG), and nitrogen precursors (e.g., NH$_3$) enlisted in block 140, but with the addition of one or more precursors of one or more p-type impurities. The growth process at block 150 may in-situ dope the p-type material with Mg, for example at a chemical concentration of at least 1e19 atoms/cm$^3$. Following block 150, the HEMT heterostructure is substantially compete.

Figure 3:
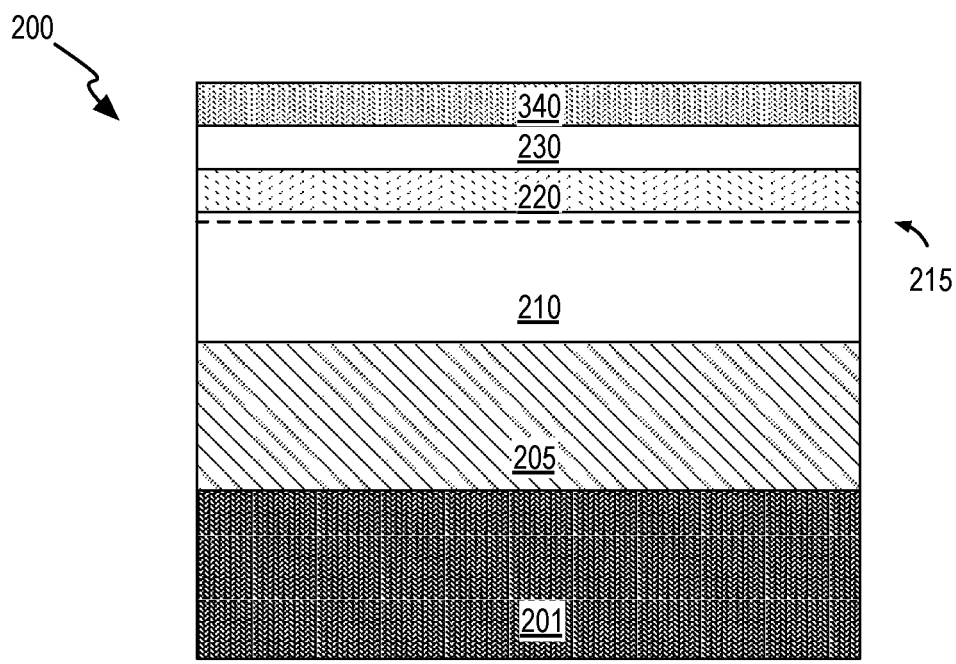

In the example illustrated in FIG. 3, a p-type material 340 is in direct contact with spacer material 230. For this example, 2DEG 215 is illustrated, but in the presence of the p-type impurities present within p-type material 340, a space-charge may alter the band structure of the heterostructure sufficiently that 2DEG 215 becomes depleted of charge carriers (electrons). In other embodiments, depletion of 2DEG 215 only occurs upon the further addition of a workfunction metal having a workfunction difference with p-type material 340 that further modulates the band structure at the interface between polarization material 220 and channel material 210 so as to deplete 2DEG 215 in the absence of any applied gate bias voltage.

In exemplary embodiments, p-type material 340 is binary GaN, although monocrystalline ternary and quaternary compositions are also possible. P-type material 340 has an acceptor impurity concentration (e.g., Mg) sufficient to render the semiconductor p-type. In some exemplary embodiments where p-type material 340 is GaN, the chemical concentration of Mg somewhere within p-type material 340 is at least 1e19 atoms/cm$^3$, advantageously more than 5e19 atoms/cm$^3$, and may be more than 1e20 atoms/cm$^3$. Electrically active impurity concentrations are somewhat lower than these chemical concentrations, however the impurity efficiency can be expected to be highest for embodiments where p-type material 340 is grown at high temperature (e.g., >900° C.). Although thickness may vary, in some exemplary embodiments of p-type material 340 has a layer thickness (z-dimension) of 5-20 nm.

Returning to FIG. 1 with the III-N heterostructure formed, methods 101 continue at block 160 where a gate is formed over the c-plane (e.g., +c for Ga-face) of the p-type material layer. Block 160 may include the deposition of a workfunction metal directly upon the p-type material according to a metal-semiconductor field effect transistor (MESFET) fabrication process. Alternatively, block 160 may include deposition of an insulator upon the p-type material followed by deposition of workfunction metal on the insulator according to a metal-insulator-semiconductor FET (MISFET) fabrication process.

In some MISFET embodiments, block 160 includes deposition of a silicon oxide and/or silicon nitride layer in contact the p-type III-N material, followed by the deposition of a workfunction metal over the silicon oxide or silicon nitride layer. In some other MISFET embodiments, block 160 includes deposition of a metal oxide in contact with at least one of the p-type III-N material or a silicon oxide/silicon nitride layer. For either MISFET or MESFET embodiments, any gate patterning technique(s) may be practiced at block 160.

Figure 4:
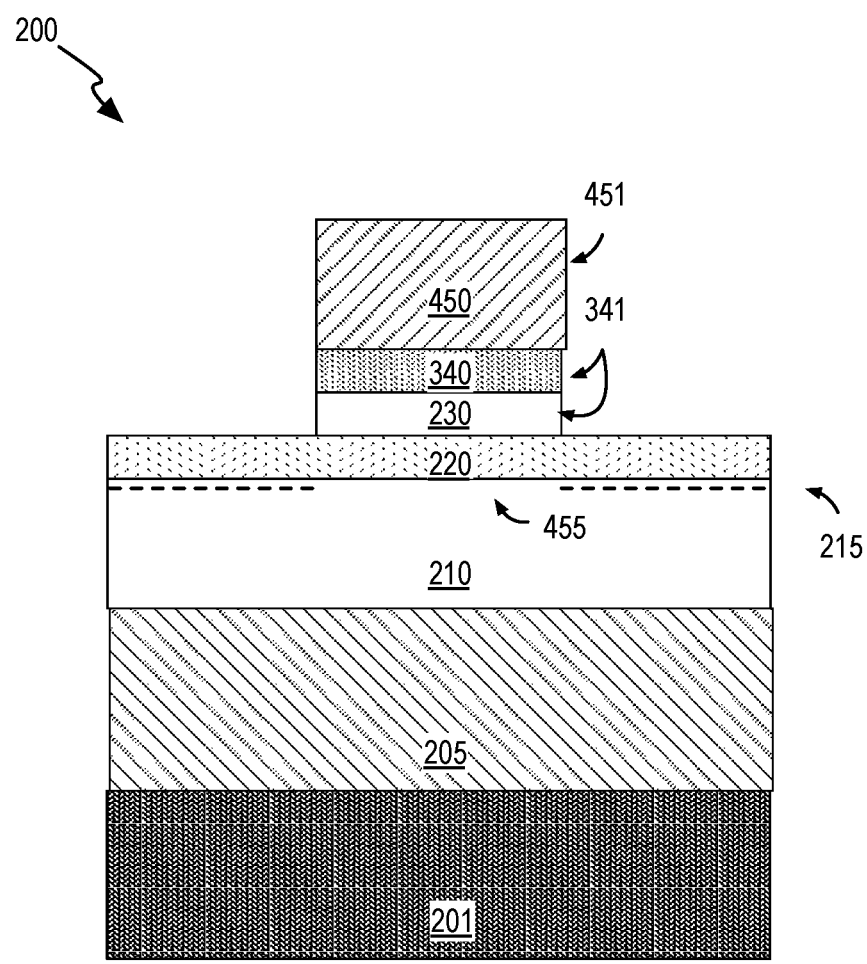

In the example illustrated in FIG. 4, transistor structure 200 includes a patterned gate 450 over a portion of the III-N heterostructure stack. Notably, gate 450 is not recessed into polarization material 220, yet in the presence of p-type material 340, 2DEG 215 is depleted within channel region 455. For MISFET embodiments, gate 450 includes an insulator in contact with p-type material 340 and a workfunction metal over the insulator layer. For MESFET embodiments, gate 450 includes a workfunction metal in contact with p-type material 340. In some MISFET embodiments, gate 450 includes a gate dielectric material having significant fixed charge, and that may, for example, include both silicon and nitrogen (e.g., $Si_3N_4$). In some other embodiments, gate 450 includes a gate dielectric material including oxygen and a metal (e.g., Hf or Al). The workfunction metal may be any metal known, which (in combination with p-type material 340 and any gate dielectric) substantially depletes 2DEG 215 within channel region 455. In the illustrated example, p-type material 340 has been subtractively patterned, for example with an etch process that removed all p-type material not protected by gate 450. Diffusion spacer material 230 is similarly etched to remove all spacer material not protected by gate 450, stopping on polarization material 220. As the result of a self-aligned patterning process, p-type material and spacer material sidewalls 341 are substantially aligned with gate sidewall 451.

Returning to FIG. 1, methods 101 continue at block 170 with the formation of source and drain terminals electrically coupled to the channel layer. The polarization layer is subtractively patterned (i.e., etched) according to a source/drain mask pattern to expose the underlying channel material, and more specifically the region within the channel material where the 2DEG resides. Any etch process(es) may be enlisted at block 170 to form openings for source and drain terminals and/or otherwise pattern the HEMT heterostructure.

One or more epitaxial growth processes may also be practiced at block 170, for example to form n-type impurity doped semiconductor regions electrically coupled to the 2DEG. In some embodiments, elevated temperatures of at least 650° C. are employed at block 170 to epitaxially grow III-N source/drain material. In-situ doping is advantageously employed during growth to achieve as high impurity dopant concentration as possible for lowest source/drain resistance. In some exemplary embodiments where donor impurities are introduced during the III-N crystal growth at block 170, in-situ doping levels are sufficient to achieve a donor impurity (e.g., Si from a precursor such as $SiH_4$) level of at least $1e18/cm^3$, and advantageously more than $1e19/cm^3$.

Methods 101 may be then completed at output 180 with any processing conventional in the art of IC fabrication to interconnect the gate, source terminal, and drain terminal to other devices (e.g. other III-N FETs) located in other regions of the substrate.

Figure 5:
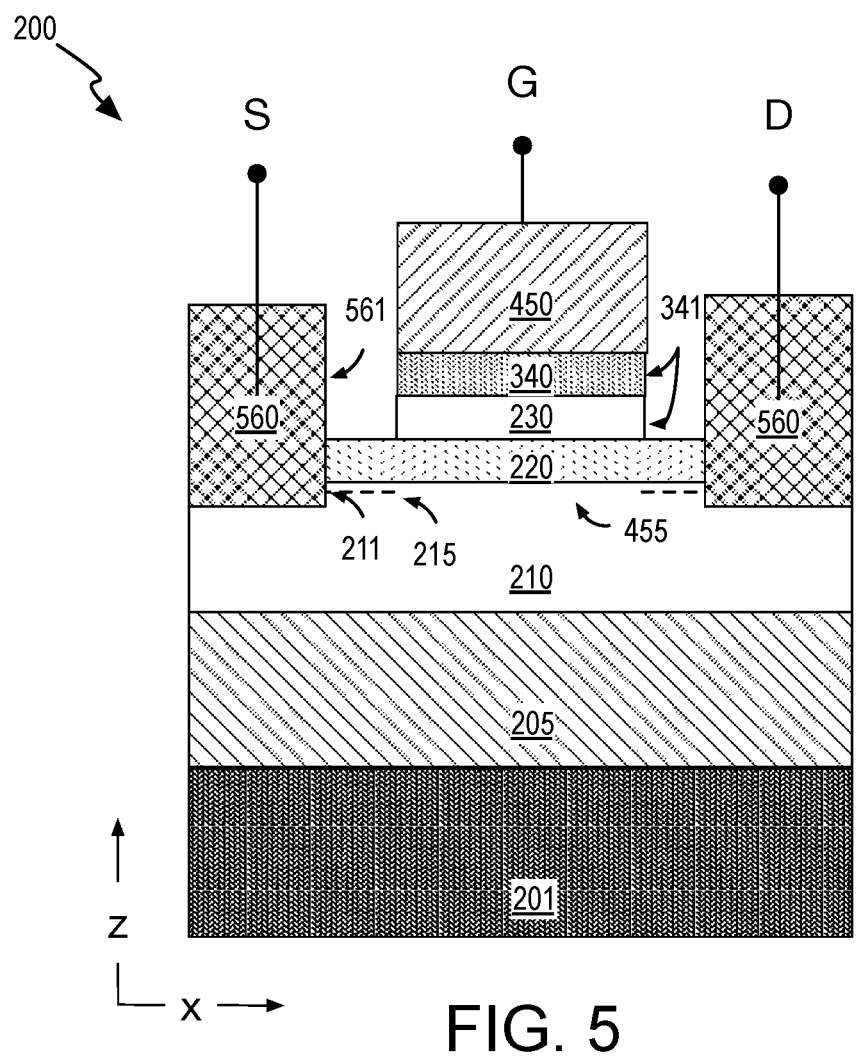

In the example illustrated in FIG. 5, transistor 200 further includes source and drain material 560. Source and drain material 560 may be binary GaN, for example. Alternatively, source and drain material 560 may include In, either as a binary alloy (InN), a ternary alloy ($Al_xIn_{1-x}Ga_{1-x}N$), or a quaternary alloy (e.g., $In_xGa_yAl_{1-x-y}N$). As shown in FIG. 5, p-type material sidewall 341 is spaced apart from source and drain material sidewall 561 to avoid an electrical short between source and drain terminals. Source and drain material sidewall 561 is in contact with channel material sidewall 211 to electrically couple with 2DEG 215. In this example, source and drain material sidewall 561 is also in contact with polarization material sidewall 220, which has high electrical resistance.

As noted above, after the formation of p-type material 340 and/or source and drain material 560, impurities from p-type material 340 can be expected to have diffused into dopant diffusion spacer material 230. Spacer material 230 may therefore no have more impurities than it had as deposited. For example, spacer material 230 may have a Mg concentration $1-5e18$ atoms/$cm^3$, or more. However, even with diffusion, Mg concentration within spacer material 230 can be expected to be much lower than within p-type material 340. For example, where Mg concentration within p-type material 340 is over $5e19$ atoms/$cm^3$, Mg concentration within spacer material 230 may be less than $5e18$ atoms/$cm^3$ for a difference of more than one order of magnitude. Notably, the presence of Mg within spacer material 230 at any concentration poses little detriment to transistor operation.

As illustrated, transistor 200 has three terminals (S/G/D) that may be further interconnected with other transistors (not depicted) within an integrated circuit (IC). Although illustrated in an "off" state, during operation source S may be biased as a first circuit node at a source voltage Vs, while drain D may be biased as a second circuit node at a drain voltage VD. Gate 450 may be biased to a non-zero voltage as a third circuit node at a gate voltage VG sufficient to allow conduction through a channel portion of transistor 200. With proper lateral spacing between the source and drain terminals, current between the two may be nearly nil in absence of a 2DEG below gate 450 when $V_{GS}=0V$. Transistor 200 is therefore an e-mode device that does not flow between source and drain material 560 when there is a zero volt gate (gate-source) bias.

Figure 6:
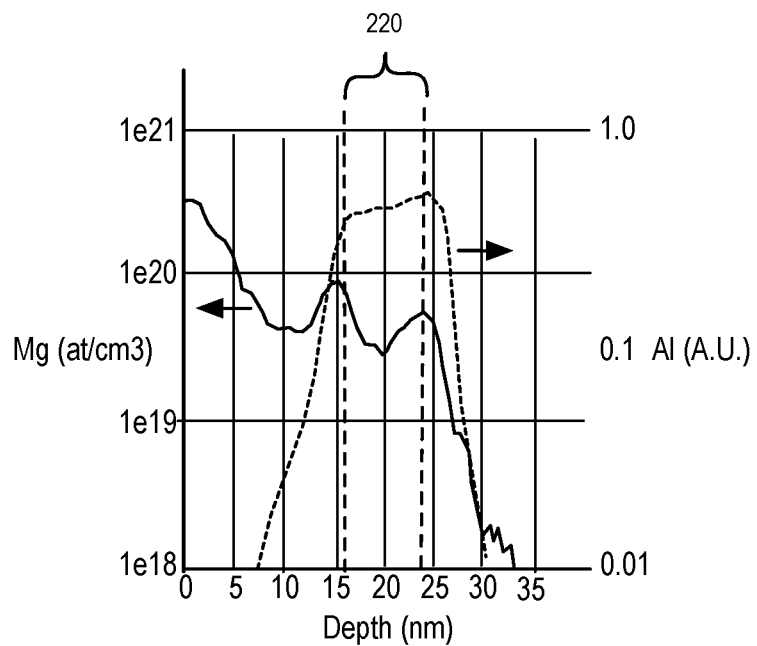
FIG. 6 is a graph of a p-type impurity concentration profile within a HEMT heterostructure lacking a dopant diffusion spacer.
Figure 7:
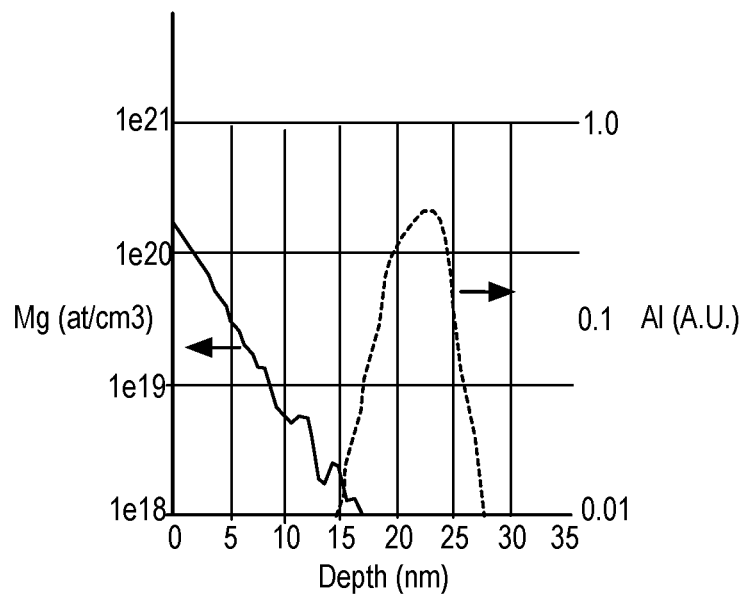
FIG. 7 is a graph of a p-type impurity concentration profile within a HEMT heterostructure including a dopant diffusion spacer in accordance with some embodiments.

As noted above, the introduction of a dopant diffusion spacer between a p-type depletion layer and a polarization layer of a III-N transistor heterostructure can significantly reduce the amount of p-type impurities present near the 2DEG of a transistor, even after diffusion of the p-type impurities during subsequent high-temperature processing. For reference, FIG. 6 depicts a depth profile of p-type impurities within a III-N heterostructure lacking a dopant diffusion spacer. In comparison, FIG. 7 depicts a depth profile of p-type impurities within a III-N heterostructure including a dopant diffusion spacer according to embodiments herein. FIGS. 6 and 7 illustrate, how one or more of nanoanalysis techniques, such as, but not limited to, transmission electron micrograph (TEM) energy dispersive X-ray spectroscopy (EDS)/energy loss spectroscopy (EELS), time of flight secondary ion mass spectroscopy (TOF-SIMS), or atom probe tomography (APT) may be enlisted to discern elemental concentrations of a transistor's III-N heterostructure.

In FIG. 6 and FIG. 7, aluminum concentration is plotted against the secondary y-axis as a marker for the location of the polarization material 220 within the heterostructure. At the left of the x-axis (minimal depths) is the p-type material layer, which in FIG. 6 has a Mg concentration profile varying between a high of about $2e20$ atom/$cm^3$ down to about $4e19$ atom/$cm^3$. As further shown in FIG. 6, there is extensive Mg diffusion into polarization material 220, particularly at its interfaces. Mg concentration within the channel material may therefore be as much as $5e18-1e19$ atom/$cm^3$ within the first few nanometers of depth where the 2DEG resides. Notably, the inventors also found the concentration peak at the channel material interface to corresponded with spatial clusters of Mg, which are thought to be particularly detrimental as perturbing the polarization layer crystal lattice and serving as efficient scattering sites that greatly decrease carrier mobility within the channel material.

In FIG. 7, Mg concentration profile again varies between a high of about 2e20 atom/cm$^3$ down to about 2e19 atom/cm$^3$. As further shown in FIG. 7, Mg concentration continues to monotonically decline through the thickness (depth) of the spacer until it is only 1-2e18 atoms/cm$^3$ where the Al content begins to increases at the interface of the polarization material 220. Through the depth of polarization material 220, Mg is less than 1e18 atoms/cm$^3$. There is therefore no pile up of Mg at the interface of the channel material. Hence, the dopant diffusion spacer in accordance with embodiments provides a region where Mg diffusion is acceptable, and prevents the Mg from clustering at the polarization material/channel material (e.g., AlGaN/GaN) interface.

Figure 8:
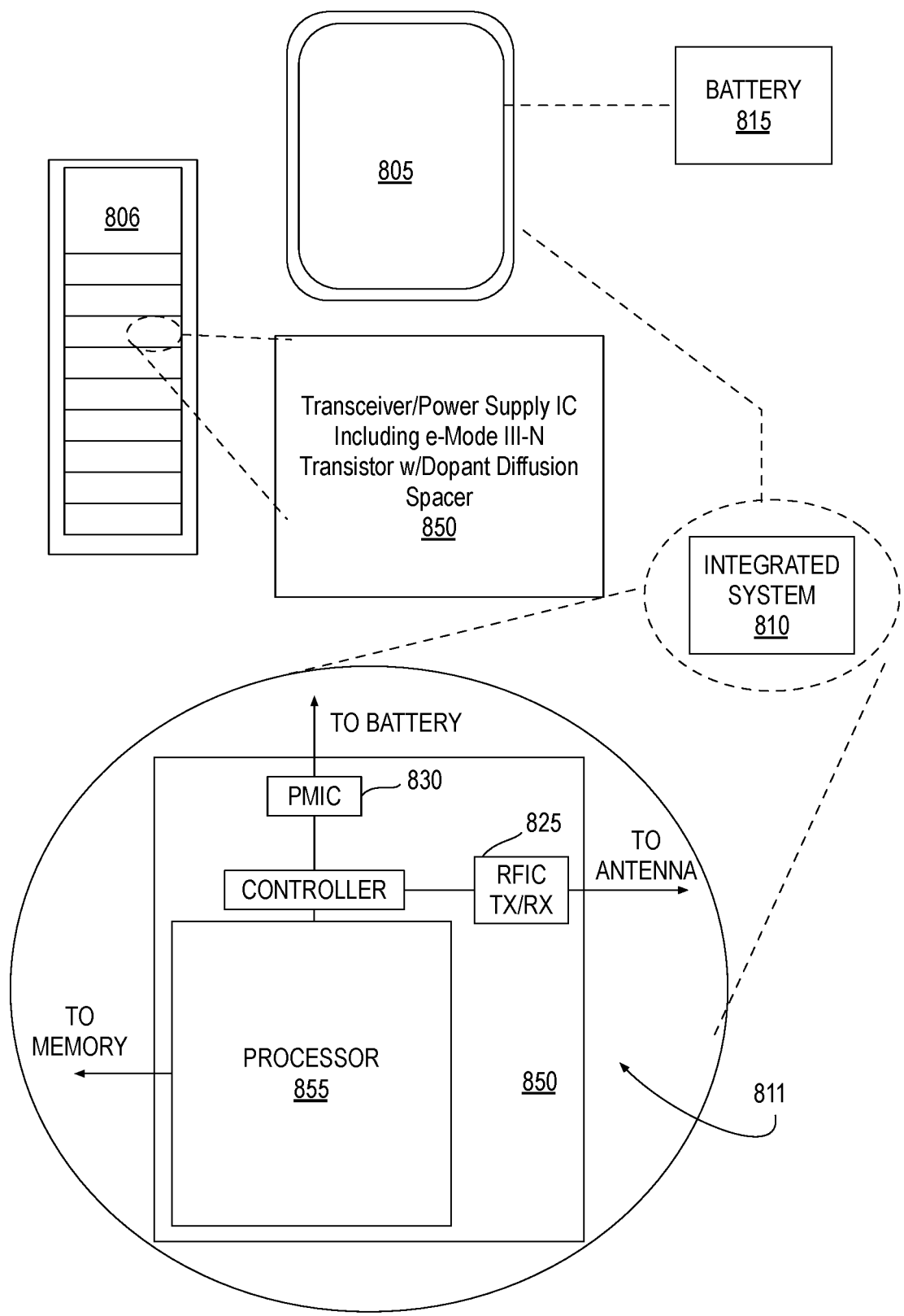
FIG. 8 illustrates a mobile computing platform and a data server machine employing an IC that includes a III-N enhancement mode HEMT, in accordance with some embodiments.

The transistor structures, and the methods of forming such structures described herein may be integrated into a wide variety of ICs and computing systems. FIG. 8 illustrates a system in which a mobile computing platform 805 and/or a data server machine 806 includes an IC chip 850 with e-mode III-N HEMTs that include a dopant diffusion barrier, for example as described elsewhere herein. The server machine 806 may be any commercial server, for example including any number of high-performance computing platforms within a rack and networked together for electronic data processing, which in the exemplary embodiment includes a monolithic IC chip 850. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level integrated system 810, and a battery 815.

Whether disposed within the integrated system 810 illustrated in the expanded view 811, or as a stand-alone packaged chip within the server machine 806, IC chip 850 may include a wireless transceiver, and/or power supply circuitry. IC chip 850 may further includes a processor 855, although it need not. At least one of the circuitries of IC chip 850 includes e-mode III-N HEMTs that have a dopant diffusion barrier, for example as described elsewhere herein. As shown in expanded view 811, IC chip 850 includes a power management IC (PMIC) 830 and radio frequency IC 825. III-N HEMT circuitry may implement high voltage portions of one or more of PMIC 830, or RF (radio frequency) integrated circuitry (RFIC) 825 including a wideband RF transmitter and/or receiver (TX/RX).

PMIC 830 may perform battery power regulation, DC-to-DC conversion, etc., and so has an input coupled to battery 815, and an output providing a current supply to other functional modules. RFIC 825 may include a digital baseband and an analog front end module further comprising a power amplifier on a transmit path and a low noise amplifier on a receive path, either of which may include a III-N HEMT in accordance with embodiments herein. RFIC 825 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 9:
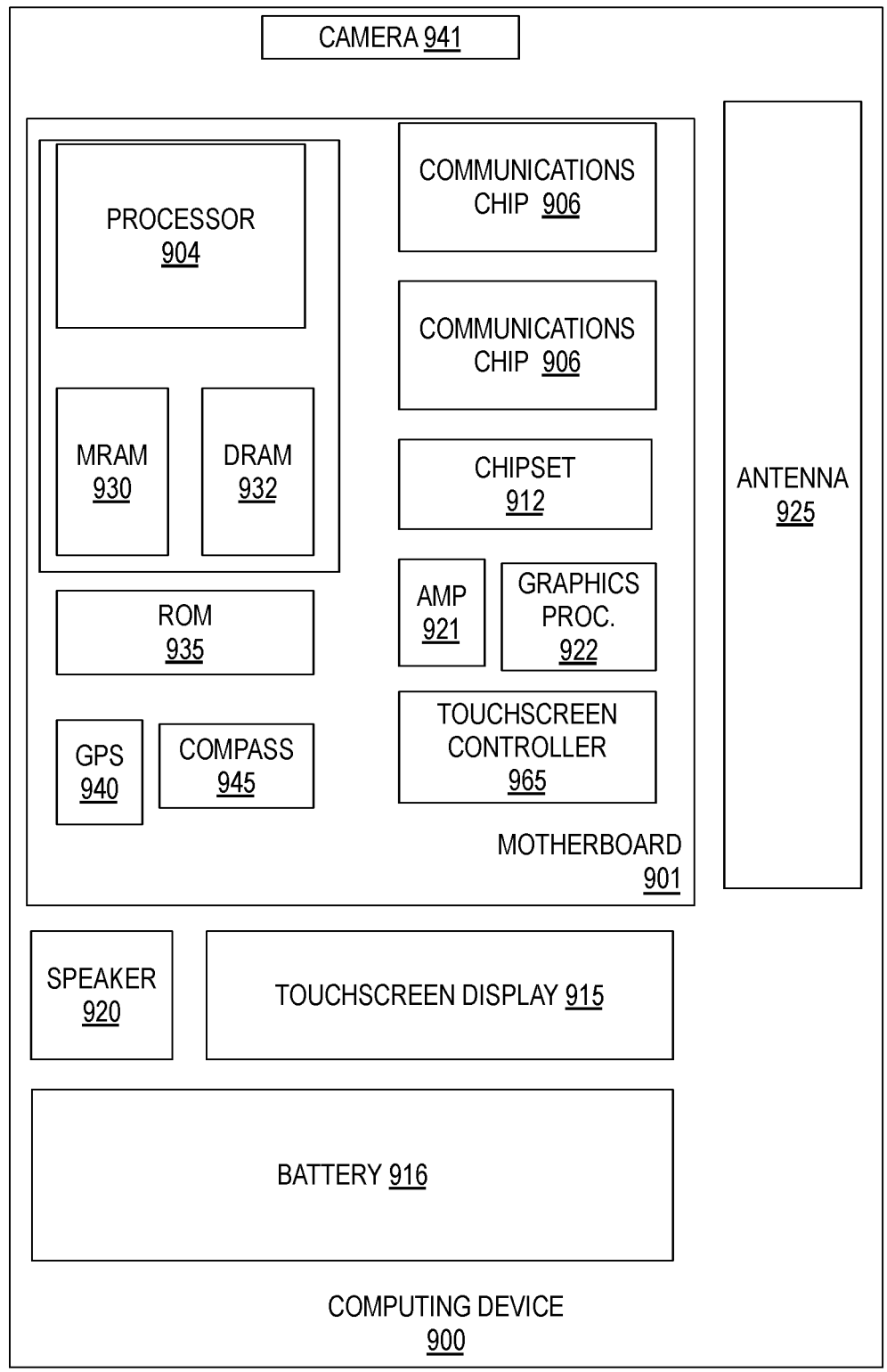
FIG. 9 is a functional block diagram of an electronic computing device, in accordance with some embodiments.

FIG. 9 is a functional block diagram of an electronic computing device 900, in accordance with some embodiments. Device 900 further includes a motherboard 901 hosting a number of components, such as, but not limited to, a processor 904 (e.g., an applications processor). Processor 904 may be physically and/or electrically coupled to motherboard 901. In some examples, processor 904 is part of a monolithic IC structure with e-mode HEMTs that include a dopant diffusion spacer, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 901. In further implementations, communication chips 906 may be part of processor 904. Depending on its applications, computing device 900 may include other components that may or may not be physically and electrically coupled to motherboard 901. These other components include, but are not limited to, volatile memory (e.g., DRAM 932), non-volatile memory (e.g., ROM 935), flash memory (e.g., NAND or NOR), magnetic memory (MRAM 930), a graphics processor 922, a digital signal processor, a crypto processor, a chipset 912, an antenna 925, touchscreen display 915, touchscreen controller 965, battery 916, audio codec, video codec, power amplifier 921, global positioning system (GPS) device 940, compass 945, accelerometer, gyroscope, speaker 920, camera 941, and mass storage device (such as hard disk drive, solid-state drive (SSD), compact disk (CD), digital versatile disk (DVD), and so forth, or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including, but not limited to, those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, and others.

While certain features set forth herein have been described with reference to various implementations, the description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that this disclosure is not limited to the embodiments so described, but can be practiced with modification and alteration without departing from the scope of the appended claims. For example, the above embodiments may include specific combinations of features as further provided below.

In first examples, a Group III-nitride (III-N) transistor comprises a channel layer comprising a first III-N material and a polarization layer over the channel layer. The polarization layer comprises a second III-N material with more Al than the first III-N material. The transistor comprises a p-type layer over the polarization layer. The p-type layer comprises a III-N material comprises a P-type impurity. The transistor comprises a spacer layer between the polarization layer and the p-type layer. The spacer layer comprises a III-N material with a lower concentration of the P-type impurity than the p-type layer. The transistor comprises a gate terminal over the spacer layer, and source and drain terminals coupled to the channel layer.

In second examples, for any of the first examples the P-type impurity comprises Mg, a concentration of Mg within the p-type layer is at least 1e19 atoms/cm3, and the spacer layer has thickness of at least 2 nm.

In third examples, for any of the first through second examples the spacer layer has a thickness of less than 10 nm, and the p-type layer has a thickness of at least 5 nm.

In fourth examples, for any of the first through third examples the p-type layer has thickness of 5-20 nm, and a concentration of Mg within the spacer layer is at least an order of magnitude lower than within the p-type layer.

In fifth examples, for any of the first through fourth examples the spacer layer and the p-type layer both comprise less Al than the polarization layer.

In sixth examples, for any of the first through fifth examples the channel layer consists essentially of Ga and N, the spacer layer consists essentially of Ga and N, the p-type layer consists essentially of Ga and N, and the polarization layer consists essentially of $Al_xGa_{1-x}N$.

In seventh examples, for any of the sixth examples x is between 0.2 and 0.5, the polarization layer has a thickness of 5-15 nm, and the channel layer has a thickness of at least 50 nm.

In eighth examples, for any of the seventh examples a concentration of Mg within the polarization layer is no more than 1e18 atoms/cm3.

In ninth examples, for any of the eighth examples a concentration of Mg within the polarization layer is no more than 1e17 atoms/cm3.

In tenth examples, for any of the first through ninth examples the transistor further includes a dielectric material between the p-type layer and the electrode.

In eleventh examples a system comprises a power supply, and a radio transceiver electrically coupled to the power supply. At least one of the power supply and the radio transceiver comprise a Group III-nitride (III-N) transistor. The III-N transistor comprises a channel layer comprising a first Group III-nitride (III-N) material and a polarization layer over the channel layer. The polarization layer comprises a second III-N material with more Al than the first III-N material. The transistor comprises a p-type layer over the polarization layer. The p-type layer comprises a III-N material comprises Mg. The transistor comprises a spacer layer between the polarization layer and the p-type layer. The spacer layer comprises a III-N material with a lower concentration of Mg than the p-type layer. The transistor comprises a gate terminal over the spacer layer, and source and drain terminals coupled to the channel layer.

In twelfth examples, for any of the eleventh examples the channel layer has a thickness of at least 50 nm and consists essentially of Ga and N. The spacer layer has a thickness of 2-10 nm and consists essentially of Ga and N. The p-type layer has a thickness of at least 5 nm and consists essentially of Ga and N with a concentration of Mg of at least 1e19 atoms/cm3. The polarization layer is 5-15 nm of $Al_xGa_{1-x}N$ with a concentration of Mg no more than 1e18 atoms/cm3.

In thirteenth examples, for any of the twelfth examples the system further comprises a battery coupled to the power supply.

In fourteenth examples the radio transceiver comprises a power amplifier on a transmit path and a low noise amplifier on a receive path, at least one of which comprises the III-N transistor.

In fifteenth examples, a method of fabricating a Group III-nitride (III-N) transistor comprises epitaxially growing a polarization layer over a channel layer comprising a first III-N material. The polarization layer comprises a second III-N material with more Al than the channel layer. The method comprises epitaxially growing a spacer layer over the polarization layer. The spacer layer comprises a III-N material with less Al than the polarization layer. The method comprises epitaxially growing a p-type layer over the spacer layer. The p-type layer comprises a III-N material with more p-type impurities than the spacer layer. The method comprises forming a gate electrode over the III-N p-type layer, and forming a source and a drain in contact with the channel layer.

In sixteenth examples, for any of the fifteenth examples epitaxially growing the spacer layer further comprises growing 2-10 nm of material with an impurity level of less than 1e16 atoms/cm3.

In seventeenth examples, for any of the sixteenth examples growing the 2-10 nm of material further comprises growing GaN at a temperature of at least 900° C.

In eighteenth examples, for any of the fifteenth through seventeenth examples epitaxially growing the p-type layer further comprises growing the III-N material with a Mg concentration of at least 1e19 atoms/cm3.

In nineteenth examples, for any of the eighteenth examples growing the III-N material with a Mg concentration of at least 1e19 atoms/cm3 further comprises growing GaN at a temperature of at least 900° C.

In twentieth examples, for any of the fifteenth through nineteenth examples epitaxially growing the polarization layer over a channel layer further comprises growing a material with more Al than the channel layer to a thickness of at least 5 nm.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed.

What is claimed is:
1. A Group III-nitride (III-N) transistor, comprising:
a channel layer comprising a first III-N material;
a polarization layer over the channel layer, wherein the polarization layer is a second III-N material with more Al than the first III-N material;
a p-type layer over the polarization layer, wherein the p-type layer is a third III-N material comprising a greater concentration of a P-type impurity than either the channel layer or the polarization layer;
a spacer layer between, and in contact with, the polarization layer and the p-type layer, wherein the spacer layer is the third III-N material, but with a lower concentration of the P-type impurity than the p-type layer;
a gate terminal over the spacer layer; and
source and drain terminals coupled to the channel layer.

2. The III-N transistor of claim 1, wherein:
the P-type impurity comprises Mg;
a concentration of Mg within the p-type layer is at least 1e19 atoms/cm$^3$; and
the spacer layer has thickness of at least 2 nm.

3. The III-N transistor of claim 2, wherein:
the spacer layer has a thickness of less than 10 nm; and
the p-type layer has a thickness of at least 5 nm.

4. The III-N transistor of claim 1, wherein:
the p-type layer has thickness of 5-20 nm; and
a concentration of the P-type impurity within the spacer layer is at least an order of magnitude lower than within the p-type layer.

5. The III-N transistor of claim 1, wherein the spacer layer and the p-type layer both comprise less Al than the polarization layer.

6. The III-N transistor of claim 1, wherein:
the first III-N material is a binary alloy of Ga and N;
the third III-N material is a binary alloy of Ga and N; and
the second III-N material is a ternary alloy of Al, Ga and N.

7. The III-N transistor of claim 6, wherein:
the polarization layer has a thickness of 5-15 nm; and
the channel layer has a thickness of at least 50 nm.

8. The III-N transistor of claim 1, wherein a concentration of the P-type impurity within the polarization layer is no more than 1e18 atoms/cm$^3$.

9. The III-N transistor of claim 8, wherein the P-type impurity is Mg and a concentration of Mg within the polarization layer is no more than 1e17 atoms/cm$^3$.

10. The III-N transistor of claim 1, further comprising a dielectric material between the p-type layer and the gate terminal.

11. A system comprising:
a power supply; and
a radio transceiver electrically coupled to the power supply, wherein at least one of the power supply and the radio transceiver comprise a Group III-nitride (III-N) transistor, and
wherein the III-N transistor comprises:
a channel layer comprising a first Group III-nitride (III-N) material;
a polarization layer over the channel layer, wherein the polarization layer comprises a second III-N material with more Al than the first III-N material;
a p-type layer over the polarization layer, wherein the p-type layer is a binary alloy of Ga and N comprising Mg;
a spacer layer between the polarization layer and the p-type layer, wherein the spacer layer is in contact with the p-type layer and is a binary alloy of Ga and N that has a lower concentration of Mg than the p-type layer;
a gate terminal over the spacer layer; and
source and drain terminals coupled to the channel layer.

12. The system of claim 11, wherein:
the channel layer has a thickness of at least 50 nm and consists essentially of Ga and N;
the spacer layer has a thickness of 2-10 nm and consists essentially of Ga and N;
the p-type layer has a thickness of at least 5 nm and consists essentially of Ga and N with a concentration of Mg of at least 1e19 atoms/cm$^3$; and
the polarization layer is 5-15 nm of $Al_xGa_{1-x}N$ with a concentration of Mg no more than 1e18 atoms/cm$^3$.

13. The system of claim 11, further comprising a battery coupled to the power supply.

14. The system of claim 11, wherein the radio transceiver comprises a power amplifier on a transmit path and a low noise amplifier on a receive path, at least one of which comprises the III-N transistor.

15. An apparatus, comprising:
a transistor channel layer comprising a first III-N material;
a polarization layer over the channel layer, wherein the polarization layer comprises a second III-N material with more Al than the first III-N material;
a p-type layer over the polarization layer, wherein the p-type layer has a thickness of at least 5 nm and comprises a III-N material comprising a P-type impurity at a concentration of at least 1e19 atoms/cm$^3$;
a spacer layer between the polarization layer and the p-type layer, wherein the spacer layer has a thickness of 2-10 nm and comprises a III-N material with a lower concentration of the P-type impurity than the p-type layer;
a transistor gate terminal over the spacer layer; and
transistor source and drain terminals coupled to the transistor channel layer.

16. The apparatus of claim 15, wherein the spacer layer is a binary alloy of Ga and N.

17. The apparatus of claim 16, wherein the p-type layer is a binary alloy of Ga and N.

18. The apparatus of claim 15, wherein a concentration of the P-type impurity within the polarization layer is no more than 1e18 atoms/cm$^3$, and wherein the concentration of the P-type impurity within the spacer layer is between the concentration of the P-type impurity within the p-type layer and the concentration of the P-type impurity within the polarization layer.

19. The apparatus of claim 15, wherein the spacer layer is in direct contact with the p-type layer.

20. The apparatus of claim 19, wherein the spacer layer is in direct contact with the polarization layer.

* * * * *